United States Patent
Yao et al.

(10) Patent No.: US 7,786,755 B2
(45) Date of Patent: Aug. 31, 2010

(54) REDUCING ERRORS IN DATA BY DYNAMICALLY CALIBRATING TRIGGER POINT THRESHOLDS

(75) Inventors: Wei Yao, Fremont, CA (US); Wei Chen, Palo Alto, CA (US); Kapil Sakariya, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/240,697

(22) Filed: Sep. 29, 2008

(65) Prior Publication Data

US 2009/0201048 A1    Aug. 13, 2009

Related U.S. Application Data

(60) Provisional application No. 61/028,483, filed on Feb. 13, 2008.

(51) Int. Cl.
*H03K 17/30* (2006.01)
(52) U.S. Cl. .......................... 326/31; 326/22
(58) Field of Classification Search .................. 326/31, 326/30; 327/78, 59; 365/5.05
See application file for complete search history.

(56) References Cited

U.S. PATENT DOCUMENTS

| | | | | |
|---|---|---|---|---|
| 3,558,917 A | * | 1/1971 | Crouse | 327/78 |
| 4,163,909 A | * | 8/1979 | Harr | 327/59 |
| 5,223,784 A | | 6/1993 | Nelson et al. | |
| 5,260,974 A | * | 11/1993 | Johnson et al. | 375/317 |
| 5,404,054 A | * | 4/1995 | Kotowski | 327/73 |
| 6,057,910 A | * | 5/2000 | Dunne | 356/5.05 |
| 7,072,804 B2 | | 7/2006 | Weller | |
| 2006/0097991 A1 | | 5/2006 | Hotelling et al. | |
| 2008/0030239 A1 | * | 2/2008 | Sullivan et al. | 327/78 |

OTHER PUBLICATIONS

K. Boyce, "An Introduction to the Mobile Industry Processor Interface (MIPI) Alliance Standard[;] Serial Low-Power Inter-Chip Media Bus (SLIMbus™)," National Semiconductor Audio Products Group, URL https://www.national.com/appinfo/audio/files/intro_to_SLIMbus.pdf, 20 pages, accessed on Oct. 2, 2008.
"SLIMbus™ Host Controller IP," Arasan Chip Systems, Inc., Version 1.4, 2008, URL http://www.arasan.com/products/prod_overview/mipi/SLIMbus-Host-pb.pdf, 2 pages, accessed on Oct. 2, 2008.
U.S. Appl. No. 12/229,685, filed Aug. 25, 2008.
U.S. Appl. No. 12/240,692, filed Sep. 29, 2008.

* cited by examiner

*Primary Examiner*—Vibol Tan
*Assistant Examiner*—Crystal L Hammond
(74) *Attorney, Agent, or Firm*—Fletcher Yoder PC

(57) ABSTRACT

Methods, systems, computer readable media and means for reducing errors in data caused by noise are provided. In some embodiments of the present invention, circuitry of the device receives timing data from one or more other circuitries and identifies noiseless periods from the timing data. The circuitry then actively adjusts the trigger point threshold of data being transmitted to and/or from the circuitry only during the noiseless periods. The circuitry subsequently monitors the timing data to identify noise periods. In response to identifying a noise period, the device ceases to adjust the trigger point threshold until the noise period is over.

18 Claims, 6 Drawing Sheets

REDUCING ERRORS IN DATA BY DYNAMICALLY CALIBRATING TRIGGER POINT THRESHOLDS

This application claims the benefit of U.S. provisional patent application No. 61/028,483, filed Feb. 13, 2008, which is hereby incorporated by reference herein in its entirety.

FIELD OF THE INVENTION

Background of the Invention

This invention is directed to methods, systems, computer readable media and means for reducing errors in data caused by noise. More particularly, this invention relates to dynamically calibrating the trigger point threshold of data transmissions only during noiseless periods of data transmissions.

Liquid crystal displays (LCDs) are commonly used today in electrical devices such as cellular phones, televisions, media players (e.g., the iPod™ media player available from Apple Inc.) and hybrid devices (e.g., the iPhone™ available from Apple Inc.). LCDs are known to have several advantages over other types of flat-panel displays (e.g., plasma displays), especially when used in portable electrical devices. For example, LCDs require relatively less electric power to operate and are relatively lighter (and therefore easier to carry). As a result, LCDs are better suited for portable electrical devices. Additionally, because LCDs utilize a relatively higher number of pixels, LCDs provide higher resolutions and therefore better presentations. LCDs are also less expensive than other displays that have similar properties.

Despite the numerous advantages of LCDs, data transmitted to and from LCDs often contain errors. Many of the errors are a result of noise generated by current flowing through the electrodes and pixels of the LCD. These problems are exacerbated when LCDs are used in portable electrical devices. More specifically, there tends to be a further increase in the noise in data transmission due to varying environmental factors (e.g., varying temperature, humidity, etc.) that can affect the flow of current in the LCD. Errors in data transmitted in a portable electrical device may adversely affect the performance of the electrical device. For example, the error may affect the electrical device's ability to present images on an LCD display.

A traditional approach to reducing errors in data transmitted between components of a handheld electrical device involves compensating for bit biasing. The trigger point threshold of data being transmitted determines where a bit switches from 1 to 0 and vice versa. In an ideal environment, the trigger point threshold is an average of the high and low trigger points during data transmission. Long strings of bits (i.e., long strings of 1's or 0's) can produce adverse switching characteristics of data being transmitted. To counteract these adverse switching characteristics, some conventional systems continuously adjust the trigger point threshold by identifying the high and low trigger points during data transmission, and determining an average of the two points. A major disadvantage of this approach is that it does not account for noise that exists in the data transmission. This noise can grossly distort the trigger point threshold, potentially rendering it too high or too low.

The present invention solves these and other problems by reducing errors in data transmitted in an electrical device using dynamic trigger point threshold calibration of the data transmitted between the components of the device.

SUMMARY OF THE INVENTION

Methods, systems, computer readable media and means are provided for dynamically calibrating the trigger point threshold of data transmitted between the components of a device. The device may be a portable electrical device.

In some embodiments of the invention, circuitry of the device receives timing data from one or more other circuitries and identifies noiseless periods from the timing data. The circuitry then actively adjusts the trigger point threshold of data being transmitted to and/or from the circuitry only during the noiseless periods. To actively adjust the trigger point threshold, the circuitry can detect a plurality of trigger point thresholds for data being transmitted to and/or from the circuitry, and can periodically set the trigger point threshold of the data as an average of the detected plurality of trigger point thresholds.

The circuitry subsequently monitors the timing data to identify noise periods. In response to identifying a noise period, the circuitry can cease to adjust the trigger point threshold until the noise period is over. In some embodiments, the circuitry can detect a last trigger point threshold before the noise period, and can set the trigger point threshold during the noise period as the detected last trigger point threshold. In other embodiments, the circuitry can detect a plurality of trigger point thresholds before the noise period, and can set the trigger point threshold during the noise period as an average of the detected plurality of trigger point thresholds.

As used herein, the term "noiseless period" does not necessarily require absolute silence in all embodiments of the invention. In some embodiments, the term simply refers to noise levels that will not cause errors in data being transmitted or utilized by components of the device.

Further features of the invention, its nature and various advantages will be more apparent from the accompanying drawings and the following detailed description.

BRIEF DESCRIPTION OF THE DRAWINGS

The above and other features of the invention, its nature and various advantages will be more apparent upon consideration of the following detailed description, taken in conjunction with the accompanying drawings in which.

DETAILED DESCRIPTION

Figure 1:
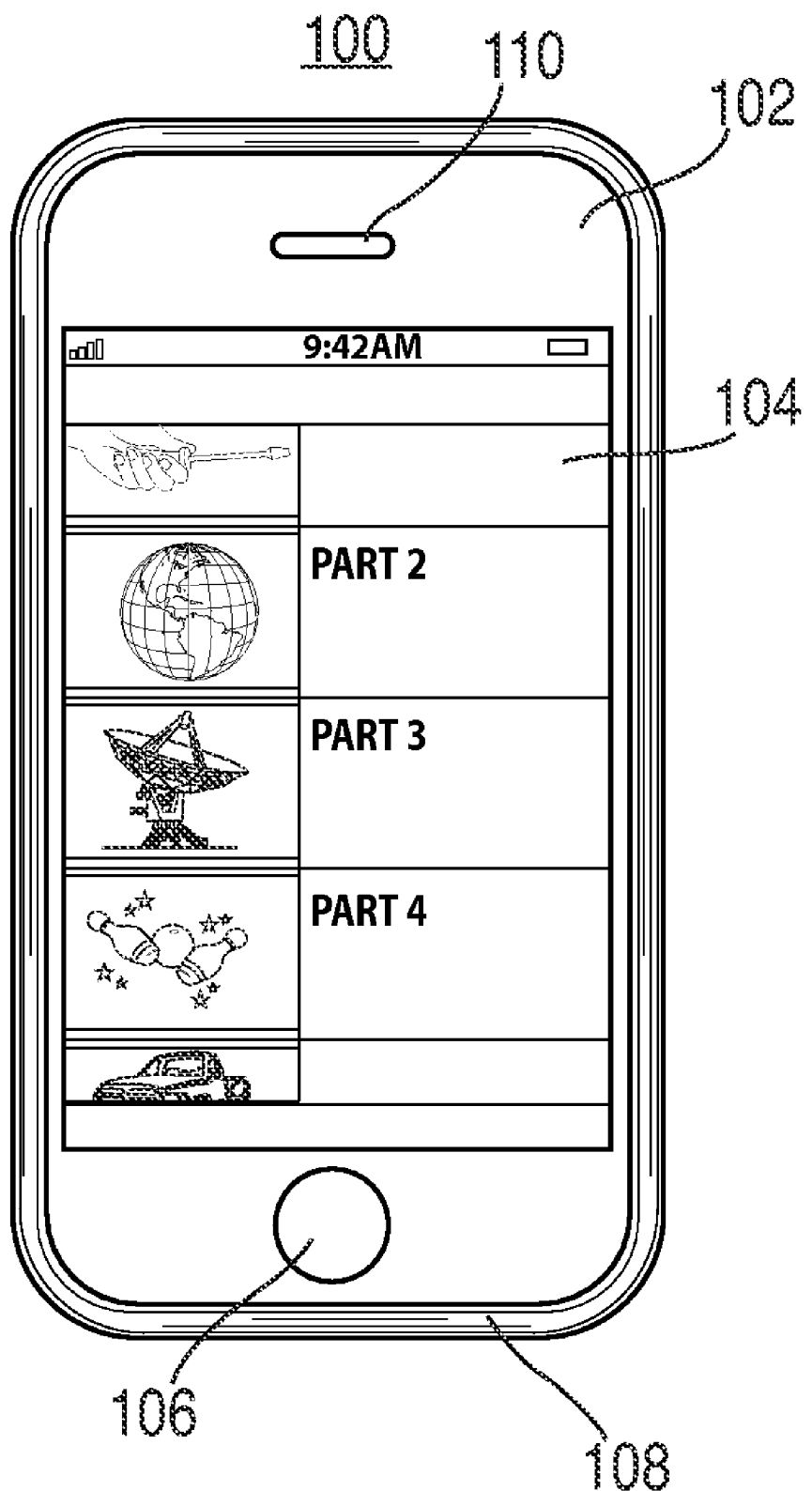
FIG. 1 is a simplified elevational view of an illustrative electrical device of the type that can benefit from the invention.

FIG. 1 shows electrical device 100, which can be used to implement some embodiments of the invention. Electrical device 100 can function as a media device, communications device, gaming device, locator device, radio receiver, web-browsing device, organization device and/or any other type of electrical device or hybrid thereof. For example, electrical device 100 can be coupled (wirelessly or via a wire) to a network or host device (such as a desktop or a laptop computer), download media data files (e.g., music, still image and video files), play the media data files, upload data to and communicate with a host device or network server, organize a user's personal information (e.g., contacts, appointments, etc.), communicate with at least one accessory or remote device (e.g., display screen, speaker system, etc.) and/or perform any other function. Although electrical device 100 is shown in FIG. 1 as being an iPhone™, which is an example of a hybrid device that combines various types of functionality into one device, one skilled in the art will appreciate that electrical device 100 can take any form and/or perform any function without departing from the spirit of the present invention.

Electrical device 100 comprises multi-touch display component 102. Multi-touch display component 102 can function as both a display component and user input component. Multi-touch display component 102 includes a transparent touch panel and a visual display component, such as a thin film transistor (TFT) LCD. The touch panel comprises a touch sensitive surface and is often positioned in front of the display screen. In this manner, the touch sensitive surface covers the viewable area of the display screen and, in response to detecting a touch event, generates a signal that can be processed and utilized by other components of electrical device 100. Multi-touch display component 102 can also include circuitry dedicated to the touch panel and/or display component. Multi-touch display screens are discussed in more detail in commonly assigned U.S. Patent Publication No. US 2006/0097991, entitled "MULTIPOINT TOUCH-SCREEN," which is incorporated by reference herein in its entirety.

Multi-touch display component 102 can present interactive displays to a user. For example, display 104 is shown in FIG. 1 and includes a number of listings, wherein each listing is associated with an image and text. In response to a user touching one of the listings, one or more integrated circuits (ICs) in multi-touch display component 102 can replace display 104 with another interactive display (not shown). Display 104 (and any other display presented by electrical device 100) can include various display elements such as overlay windows, images, video, text, etc.

Electrical device 100 can also include one or more other user interface components, such as button 106, which can be used to supplement multi-touch display component 102. One skilled in the art will appreciate that, regardless of what is shown in FIG. 1, electrical device 100 can include any type of user input component(s), such as, for example, click wheel, scroll wheel, QWERTY keyboard, number pad, switch, etc.

Electrical device 100 can also include microphone 108 and audio output 110, which are respective examples of other types of input and output components. Microphone 108 and audio output 110 are shown as being integrated into electrical device 100, but one skilled in the art will appreciate that an external device (e.g., headphones, wireless devices such as Bluetooth earpieces or any other accessory device) or a connector can be used to facilitate the receiving and playing back of audio signals and/or the audio portion of video or other multi-media files. Additional input/output components, such as a camera and/or haptic feedback component, can also be integrated into and/or coupled to electrical device 100 via the electrical device's connector component (not shown).

Figure 2:
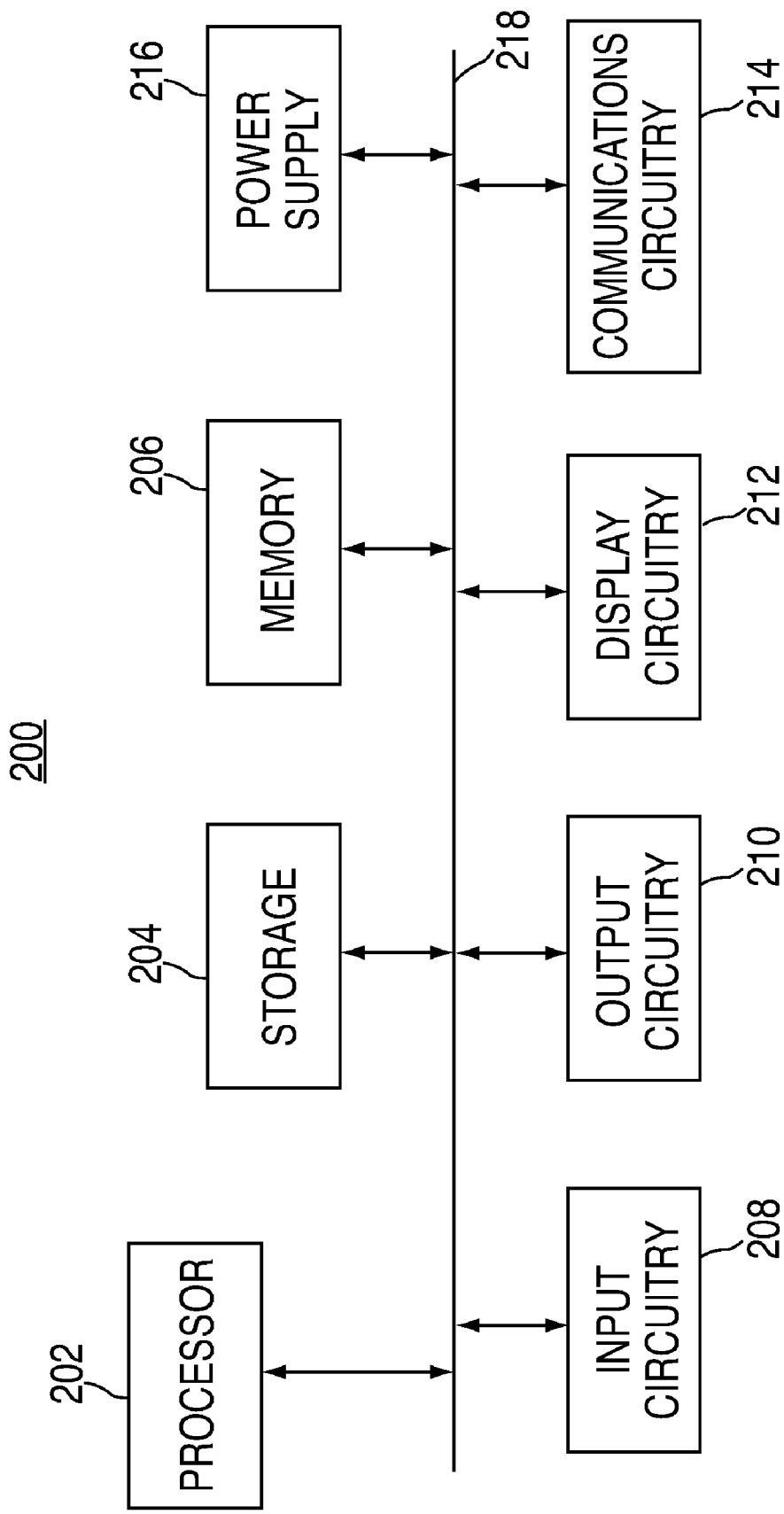
FIG. 2 is a simplified block diagram of an illustrative embodiment of circuitry that may be included in an electrical device of the type shown in FIG. 1.

Electronic circuitry 200 inside electrical device 100 may have an overall organization like that shown in FIG. 2. Circuitry 200 may include processor 202, storage 204, memory 206, input circuitry 208, output circuitry 210, display circuitry 212, communications circuitry 214, power supply 216 and bus 218. One skilled in the art will appreciate that, in some embodiments, circuitry 200 can include more than one of each component or circuitry, and that to avoid over-complicating the drawing, only one of each is shown in FIG. 2. In addition, one skilled in the art will appreciate that the functionality of certain components (and their correspond circuitry) can be combined or omitted and that additional components, circuitry, and connections, which are not shown in FIG. 2, can be included in circuitry 200 without departing from the spirit of the invention.

Processor 202 can be any type of processor such as a processor that uses ARM architecture (e.g., Marvell's XScale or Texas Instrument's OMAP series processors), any other processor suitable for a portable electrical device, or any processor that meets the needs of electrical device 100. Processor 202 can be configured to enable electrical device 100 to perform any function electrical device 100 is required to perform. As an example, processor 202 may send commands to display circuitry 212 and in response, display circuitry 212 can present a display to a user. Processor 202 may also be used to run operating system applications, firmware applications, media playback applications, media editing applications and/or any other application.

Storage 204 can be one or more storage mediums including a hard-drive, solid-state drive (e.g., NAND flash memory), other type of non-volatile memory (such as ROM), any other suitable type of storage component, or any combination thereof. Storage 204 may store media data (e.g., audio and video files), application data (e.g., for implementing functions on electrical device 100), firmware, wireless connection information data (e.g., information that enables electrical device 100 to establish a wireless connection), subscription information data (e.g., information that keeps track of podcasts or audio broadcasts or other media a user subscribes to), contact information data (e.g., telephone numbers and email addresses), calendar information data, any other suitable data, or any combination thereof. The data may be formatted and organized in one or more types of data files.

Memory 206 can include cache memory, semi-permanent or volatile memory such as RAM, and/or one or more different types of memory used for temporarily storing data. Memory 206 can also be used for storing data used to operate applications electrical device 100 is running.

Input circuitry 208 can convert (and encode/decode, if necessary) analog signals and other signals (e.g., physical contact inputs from a multi-touch screen and/or physical movements from a mouse), into digital signals. The digital signals can be provided to processor 202, storage 204, memory 206, or any other component of circuitry 200. Although input circuitry 208 is illustrated in FIG. 2 as a single component of circuitry 200, a plurality of input circuitries can be included in circuitry 200. Input circuitry 208 can be used to interface with any input component, such as microphone 108 discussed above in connection with FIG. 1. For example, circuitry 200 can include specialized input circuitry associated with one or more microphones, cameras, proximity sensors, accelerometers, ambient light detectors, etc. Input circuitry 208 can include input driver circuitry (e.g., touch driver circuitry) and/or circuitry for driving input driver(s). As another example, the input circuitry of a multi-touch screen can be integrated into or coupled directly to the touch panel portion of the multi-touch screen component of an electrical device.

Output circuitry 210 can convert (and encode/decode, if necessary) digital signals into analog signals (analog audio signals, analog video signals, etc.). Output circuitry 210 may receive digital signals from processor 202 or any other component of circuitry 200 and convert digital signals into analog signals. Although output circuitry 210 is illustrated in FIG. 2 as a single component of circuitry 200, a plurality of output circuitries can be included in circuitry 200. Output circuitry 210 can be used to interface with any output component, such as audio output 110 discussed in connection with FIG. 1. For example, electrical device 100 can include specialized output circuitry associated with output devices such as speakers.

Display circuitry 212 is an example of specialized output circuitry. Display circuitry 212 can accept and/or generate signals for presenting displays (including textual, video and/or graphical information) on a display such as multi-touch display component 102 discussed above. For example, display circuitry 212 can include a coder/decoder (CODEC) to convert digital media data into analog signals.

Display circuitry 212 can also include display driver circuitry and/or circuitry for driving display driver(s). The display signals can be generated by processor 202 or display circuitry 212. The display signals can provide media information related to media data received from communications circuitry 214 and/or any other component of circuitry 200. In some embodiments, display circuitry 212, like any other component discussed herein, can be integrated into and/or electrically coupled to electrical device 100. For example, display circuitry 212 can be integrated into the display component of a multi-touch display component 102 and can communicate directly with processor 202 and/or input circuitry 208.

Communications circuitry 214 can permit electrical device 100 to communicate with one or more servers or other devices using any suitable communications protocol. For example, communications circuitry 214 may support Wi-Fi (e.g., a 802.11 protocol), Ethernet, Bluetooth™, high frequency systems (e.g., 900 MHz, 2.4 GHz, and 5.6 GHz communication systems), infrared, TCP/IP, HTTP, BitTorrent, FTP, RTP, RTSP, SSH, any other communications protocol, or any combination thereof.

Power supply 216 can provide power to the components of circuitry 200. In some embodiments, power supply 216 can be coupled to a power grid (e.g., a wall outlet, automobile cigarette lighter, etc.). Power supply 216 can also include one or more batteries for providing power to a portable electrical device. As another example, power supply 216 can be configured to generate power in a portable electrical device from a natural source (e.g., solar cells).

Bus 218 can provide a data transfer path for transferring data signals to, from, or between processor 202, storage 204, memory 206, communications circuitry 214, and any other component(s) included in circuitry 200.

In some embodiments, electrical device 100 may be coupled to one or more other devices (not shown) for performing any suitable operation that may require electrical device 100 and any other device to be coupled together. Electrical device 100 may be coupled to a host, slave, master and/or accessory device. The other device may perform operations such as data transfers and software or firmware updates. The other device may also execute one or more operations in lieu of electrical device 100 when, for example, memory 206 does not have enough memory space, or processor 202 does not have enough processing power to perform the operations efficiently. Alternatively, the other device may perform one or more operations in conjunction with electrical device 100 so as to increase the efficiency of electrical device 100. For example, if electrical device 100 needs to perform several steps in a process, electrical device 100 may execute some of the steps while the other device executes the rest.

Electrical device 100 may be coupled with another device over a communications link using any suitable approach. As an example, the communications link may be any suitable wireless connection. The communications link may support any suitable wireless protocol such as, for example, Wi-Fi (e.g., a 802.11 protocol), Bluetooth®, infrared, GSM, GSM plus EDGE, CDMA, quadband, or any other suitable wireless protocol. Alternatively, the communications link may be a wired link that is coupled to both electrical device 100 and the other device (e.g., a wire with a USB connector or a 30-pin connector). A combination of wired and wireless links may also be used to couple electrical device 100 with another device.

Figure 3:
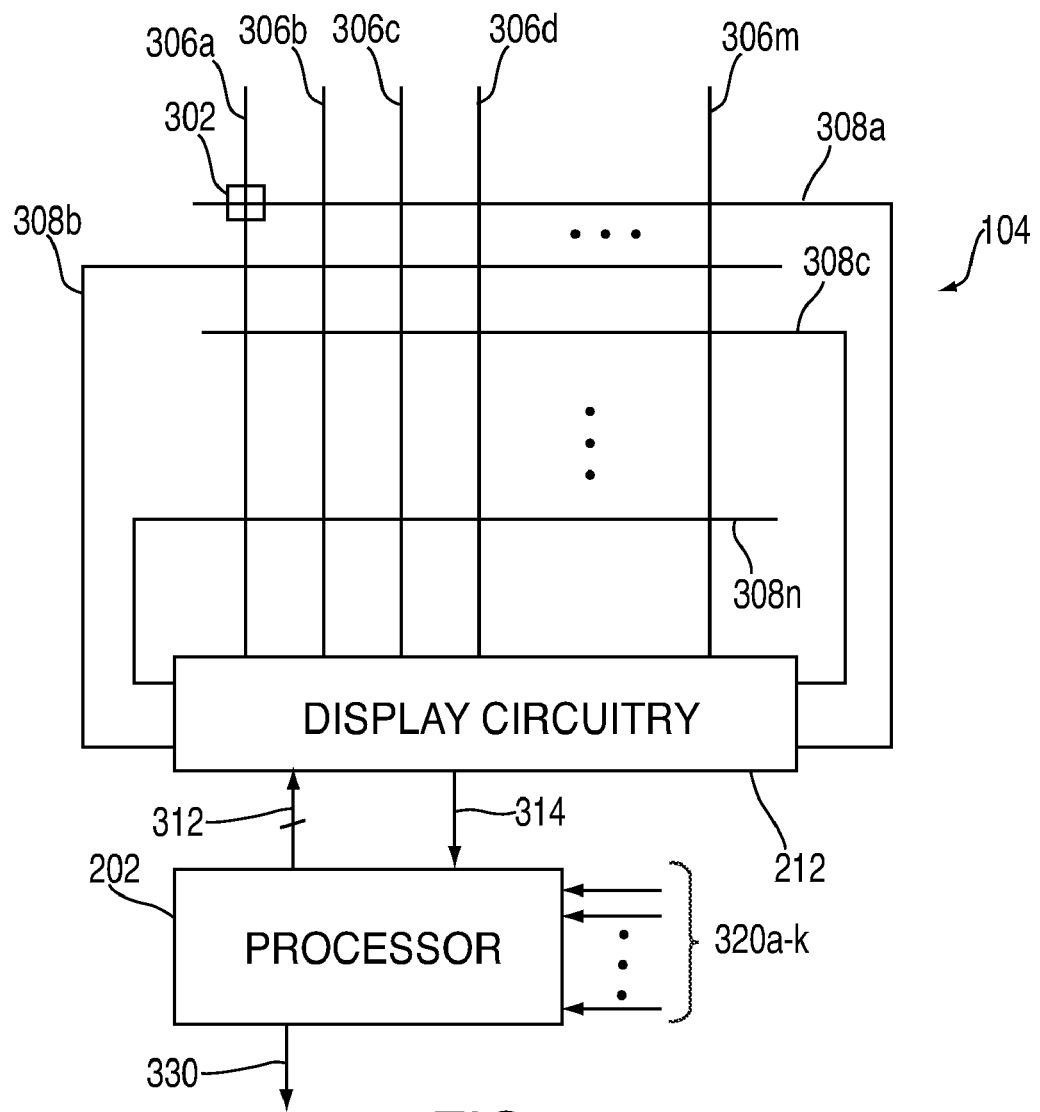
FIG. 3 is a simplified schematic block diagram of an illustrative embodiment of certain components from FIG. 2 in accordance with the invention.

FIG. 3 focuses somewhat more specifically on a portion of FIG. 2, with additional elements shown (including elements in accordance with the invention). In particular, FIG. 3 shows processor 202 applying data signals 312 to display circuitry 212. Display circuitry 212 controls the signals on a plurality of source lines 306a-m and a plurality of gate lines 308a-n. (Reference characters m and n are arbitrary index limit values.) The visual appearance of a pixel 302 at a source-line/gate-line intersection is controlled by the signals on those source and gate lines. Only one representative pixel 302 is shown in FIG. 3 to avoid over-complicating the drawing.

Figure 4:
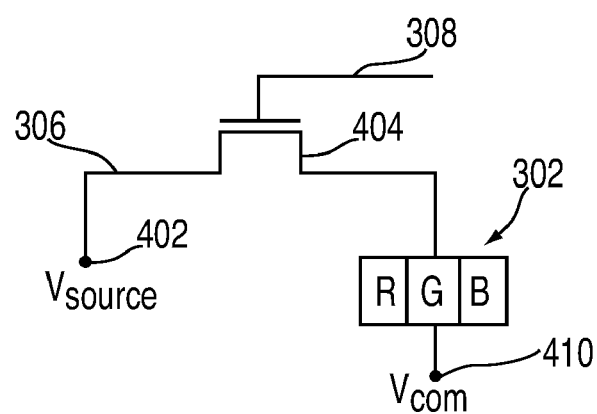
FIG. 4 is a simplified schematic block diagram of a representative portion of certain circuitry of the type shown in FIG. 3.

The circuitry associated with a typical pixel 302 is shown in more detail in FIG. 4. There it will be seen how a gate line signal 308 controls (via a transistor switch 404) application of a Vsource voltage to one electrode of pixel 302. The other electrode of pixel 302 is connected to a Vcommon (or Vcom) voltage. Pixel 302 includes red (R), green (G), and blue (B) display capability. Again, the visual appearance of pixel 302 is controlled by the voltage across its electrodes.

Returning to FIG. 3, data for controlling display 104 is applied to display circuitry 212 via leads 312. Display circuitry 212 typically includes several "layers" of circuitry performing a variety of tasks on the data signals received via leads 312. For example, it is typically necessary for display circuitry 212 to (1) assemble successive bytes of data from these signals, (2) look for errors in the data, (3) minimize any such errors to the extent possible, (4) process the data into the form suitable for controlling display 104, and (5) actually use the processed data to drive the display (i.e., via source and gate lines 306 and 308).

The operations described in the preceding paragraph are typically complex operations involving large amounts of data that must be handled at very high data rates. To facilitate such data signaling and data handling operations, various industry-standard data communication protocols (e.g., the Mobile Pixel Link (MPL) protocol and the Mobile Industry Protocol Interface (MIPI) protocol) are known. Alternatively, a generally similar customized data communication protocol may be developed and employed. However, even with the benefit of all of this technology, the data signals 312 received by circuitry 212 can sometimes be corrupted by noise (electrical interference) from other sources in electrical device 100 to a degree that is beyond the error-correction capability of circuitry 212. For example, the operation of a display component (e.g., the flow of power through the gate and/or source lines, as well as the charging of pixels) can result in noise that adversely impacts data. Thus display 104 itself may constitute a noise source in electrical device 100. As another example, transmitting data from central processor 202 to display circuitry 212 without satisfying timing conditions for transmission may be another source of noise. Another source of noise may be a faulty connection between central processor 202 and display circuitry 212. Noise may also be created as a result of a user interaction with electrical device 100. For example, if electrical device 100 includes a touch screen, information transmitted from that screen to processor 202 may include noise. Typically contributing to sensitivity or susceptibility of signals 312 to noise are the relatively low power, low voltage swing, and high data rates of such signals. Whatever its source, such noise that causes uncorrectable data errors in signals 312 can result in errors in what the user sees on display 104, and this is very undesirable.

In accordance with the present invention, display circuitry 212 is equipped with an output lead 314 on which at least certain kinds of data errors detected by circuitry 212 are indicted (by an error indication in an error signal) as soon as possible after circuitry 212 has detected such a data error. Thus such an error indication is preferably output from component 212 (on lead 314) substantially concurrently with detection of a data error by data signal receiving and handling circuitry of component 212. In the embodiment shown in FIG. 3 error signal 314 is applied to processor 202. Also in this embodiment, processor 202 receives a plurality of other input signals 320a-k (where k is an arbitrary index limit value), each of which signals 320 may include a noise component from a respective noise source elsewhere in electrical device 100. Examples of possible noise sources that may supply signals 320a-k have been identified earlier in this specification. To recapitulate just a few of these examples, one of signals 320 may indicate power supply noise of electrical device 100. Another of signals 320 may indicate touch screen noise of electrical device 100. Still another of signals 320 may indicate display noise of electrical device 100. Others of signals 320 may indicate noise from other possible noise sources on electrical device 100.

Figure 5:
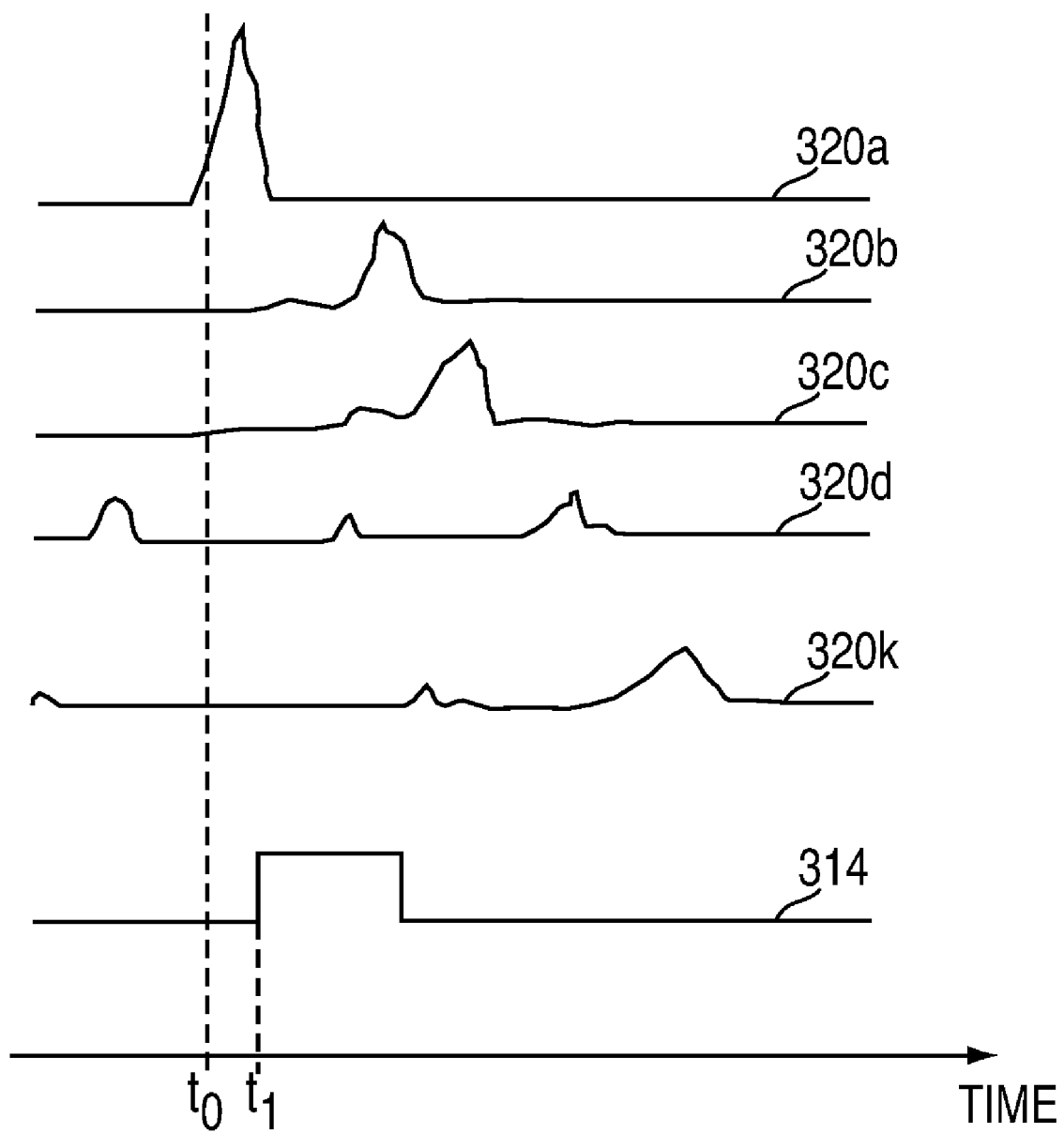
FIG. 5 is a plot of several illustrative circuit traces that are useful in explaining certain aspects of the invention.

FIG. 5 shows an example of some noise signal waveforms that processor 202 may receive via leads 320. Each of these waveforms is identified by the same reference number as the lead 320 on which that waveform is received by processor 202. The presence of noise from a source associated with any one of signals 320 is indicated by that signal having a higher level than otherwise. The greater the noise from a given source, the higher the concurrent (or at least substantially concurrent) level of the associated noise signal 320. Thus an elevated level in any one of noise signals 320 in FIG. 5 constitutes a noise indication in that signal.

FIG. 5 also shows an example of an error signal waveform that display circuitry 212 may output via lead 314. Again, this error signal waveform is identified by the same reference number (314) as the lead on which that waveform is received by processor 202. A relatively low level of signal 314 indicates no error output indication from display circuitry 212. A high level of signal 314 indicates that display circuitry 212 has concurrently (or at least substantially concurrently) detected an error. All of signals 320 and 314 are plotted against the same horizontal time base in FIG. 5 (earlier time to the left; later time to the right).

In the particular example shown in FIG. 5, it will be noted that signal 314 begins (at time t1) to indicate an error in display circuitry 212 shortly after signal 320a begins (at about time t0) to indicate a significant amount of noise from the source associated with signal 320a. Processor 202 detects this timing correlation between the noise burst in signal 320a and the error indication in signal 314, and processor 202 accordingly outputs (via lead 330) an indication that noise from the source associated with signal 320a may have produced the error indicated at time t1. Others of signals 320b-k in FIG. 5 also indicate noise from their associated sources at various other times, but these other noise indications are not sufficiently closely correlated in time to the t1 error indication to have been likely causes of that error indication. Processor 202 detects this lack of correlation between these other noises and the t1 error indication and can thereby rule out attributing the t1 error indication to these other noise sources. Again, the noise and error correlation is closest for the noise burst in signal 320a, and so processor 202 identifies (via lead 330) that noise from the source associated with signal 320a may have caused the error at t1.

In some embodiments of the present invention, the various components (and corresponding circuitry) of electrical device 100, which were discussed above in connection with FIGS. 1-5, can generate timing data based on their operations, and can transfer the timing data to one or more other components (or corresponding circuitry). The timing data can indicate, among other things, when noiseless periods occur (i.e., have occurred, are occurring and/or will be occurring). As discussed above with respect to FIGS. 1-5, there may be noise present in the data transmitted between the components of electrical device 100. However, there may be a period of time, defined as a noiseless period, when the noise in data transmission is reduced. For example, a video blanking period is a noiseless period. A noiseless period can occur consistently at a known frequency (e.g., 60 hz) for a set amount of time (e.g., 15 microseconds).

The timing data transferred between the various components (and corresponding circuitry) of electrical device 100 can be monitored to detect noiseless periods in order to coordinate the operations of electrical device 100 with the noiseless periods. This can ensure that the operations of electrical device 100 are executed more efficiently. For example, electrical device 100 can actively adjust the trigger point threshold of data transmitted between the components (and corresponding circuitry) of electrical device 100 during a noiseless period.

In particular, circuitry of the device receives timing data from one or more other circuitries, and identifies noiseless periods from the timing data. The circuitry then actively adjusts the trigger point threshold of data being transmitted to and/or from the circuitry only during the noiseless periods. For example, the circuitry can adjust the trigger point threshold by detecting a plurality of trigger point thresholds for the data being transmitted to and/or from the circuitry, and can periodically set the trigger point threshold as the average of the detected plurality of trigger point thresholds.

The circuitry subsequently monitors the timing data to identify noise periods. In response to identifying a noise period, the circuitry ceases to adjust the trigger point threshold until the noise period is over. In some embodiments, the circuitry can cease to adjust the trigger point threshold by setting a trigger point threshold for the noise period. For example, the circuitry can detect a last trigger point threshold before the noise period, and can set the trigger point threshold during the noise period as the detected last trigger point threshold. As another example, the circuitry can detect a plurality of trigger point thresholds before the noise period, and can set the trigger point threshold during the noise period as the average of the detected plurality of trigger point thresholds.

Figure 6:
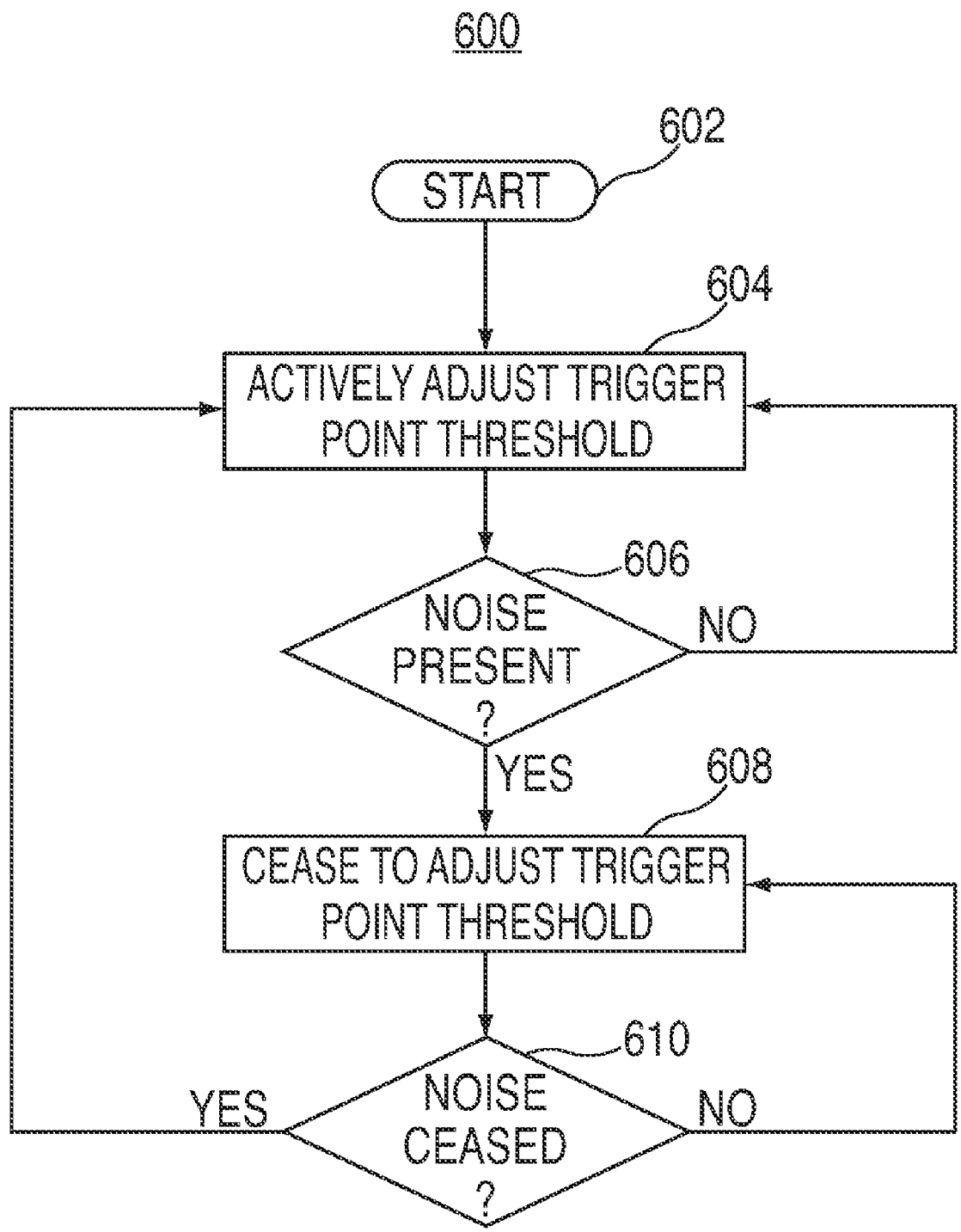
FIG. 6 is a simplified logical flow diagram of exemplary methods in accordance with some embodiments of the invention.

FIG. 6 is a process that illustrates how electrical device 100 can dynamically calibrate trigger point thresholds of data transmitted between the components (and corresponding circuitry) of electrical device 100 only during noiseless periods. The process discussed below is intended to be illustrative and not limiting. One skilled in the art will appreciate that steps of the process discussed herein may be omitted, modified, combined, and/or rearranged, and any additional steps may be performed without departing from the scope of the invention.

Process 600 begins at step 602. At step 604, the electrical device actively adjusts the trigger point threshold during noiseless periods. At step 606, the electrical device determines whether noise is present, i.e., when the predictable noiseless period ends or when random is present. In response to determining that there is no noise present, process 600 returns to step 604 and continues to actively adjust the trigger point threshold during noiseless periods.

In response to the electrical device determining that noise is present at step 606, process 600 proceeds to step 608, where the device ceases to adjust the trigger point threshold. In other words, the device only dynamically adjusts the trigger point threshold when there is no noise affecting the trigger point threshold. In this manner, the present invention is aware of the existence of noise and locks the trigger point threshold when noise is present, whether the noise is included in a predicable noise period or is random noise. In some embodiments, the locked value of the trigger point is based on the last value before the noise began. In other embodiments, the locked value is based on an average of previous trigger point thresholds (e.g., all values since the last bit of noise, a sampling of the values since the last bit of noise, the values over the last 10 milliseconds, or the average of any other set of values).

Process 600 then proceeds to step 610, where the electrical device determines whether or not the noise has ceased. If the noise has not ceased, process 600 returns to step 608 and the device does not adjust the trigger point threshold. If the noise has ceased, process 600 proceeds to step 604 where the device actively adjusts the trigger point threshold.

Figure 7:
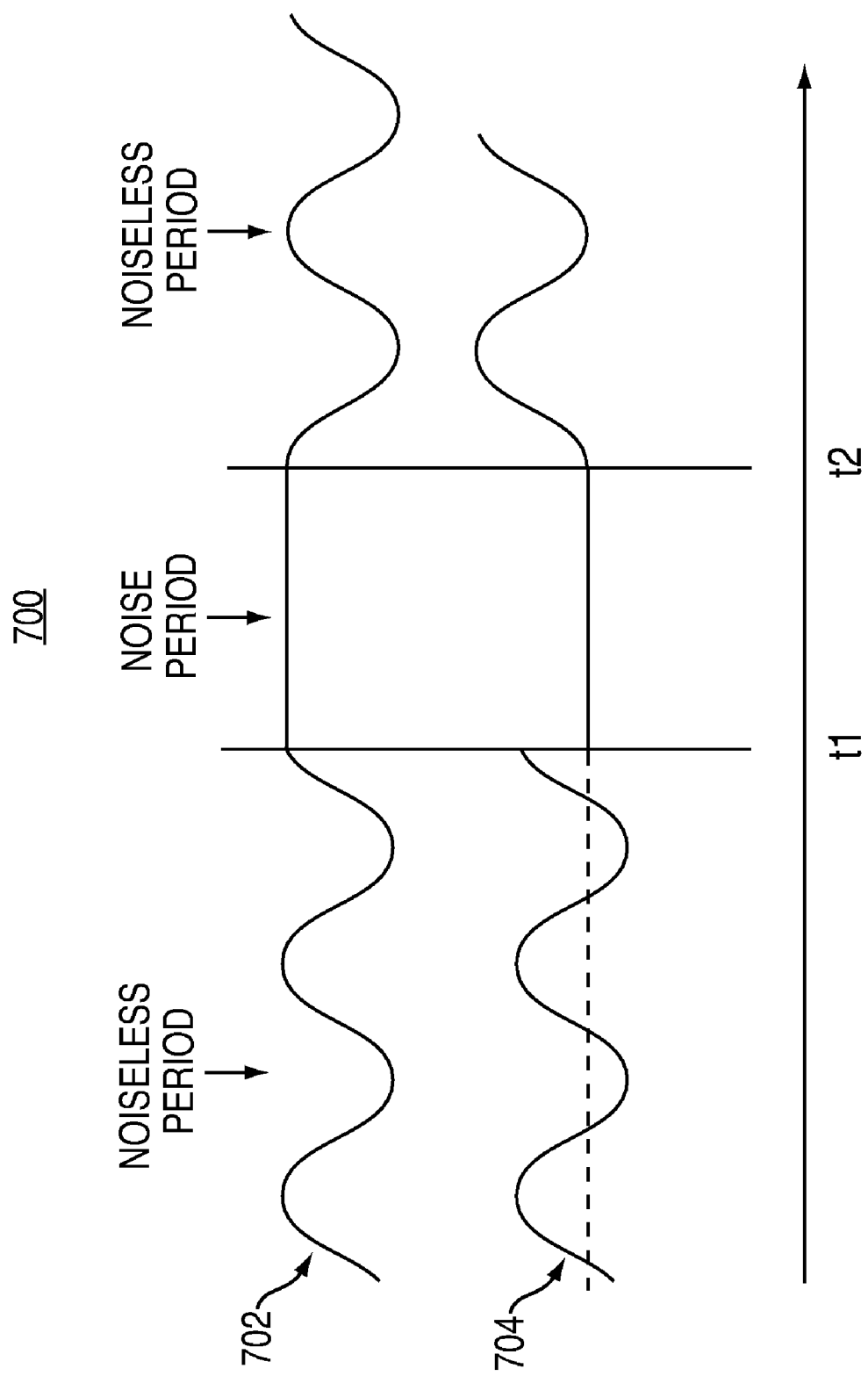
FIG. 7 is a plot of illustrative circuit traces that are useful in explaining certain aspects of the invention.

For example, FIG. 7 shows timing diagram 700, which illustrates the two approaches for determining the trigger point threshold when noise is present between times t1 and t2. Value signal 702, for example, simply locks the last trigger point threshold when noise is detected. Value signal 704, on the other hand, sets the trigger point threshold at an average of the noiseless period (i.e., the period prior to time t1) trigger point thresholds.

The above is meant to be exemplary only and not limiting in any manner. One skilled in the art will appreciate various other advantages of the present invention that are not explicitly stated above.

What is claimed is:

1. A method of calibrating a trigger point threshold of data being transferred to first circuitry of an electrical device from second circuitry of the electrical device, comprising:
   actively adjusting the trigger point threshold, wherein the trigger point threshold determines where bits of the data being transferred from the first circuitry to the second circuitry switch value;
   determining whether noise is present;
   in response to determining the noise is present, ceasing to adjust the trigger point threshold;
   determining whether the noise has ceased; and
   in response to determining that the noise has ceased, actively adjusting the trigger point threshold.

2. The method of claim 1, wherein determining whether the noise is present further comprises transferring timing data from the second circuitry to the first circuitry.

3. The method of claim 1, wherein determining whether the noise is present further comprises transferring timing data from a third circuitry to the first circuitry.

4. The method of claim 1, wherein determining the noise is present further comprises identifying a noise period in timing data.

5. The method of claim 1, wherein actively adjusting the trigger point threshold further comprises detecting a plurality of trigger point thresholds.

6. The method of claim 5, wherein actively adjusting the trigger point threshold further comprises periodically setting the trigger point threshold as an average of the detected plurality of trigger point thresholds.

7. The method of claim 1, wherein ceasing to adjust the trigger point threshold further comprises detecting a last trigger point threshold prior to determining the noise is present.

8. The method of claim 7, wherein ceasing to adjust the trigger point threshold further comprises setting the trigger point threshold as the detected last trigger point threshold.

9. The method of claim 1, wherein ceasing to adjust the trigger point threshold further comprises detecting a plurality of trigger point thresholds prior to determining the noise is present.

10. The method of claim 9, wherein ceasing to adjust the trigger point threshold further comprises setting the trigger point threshold as an average of the detected plurality of trigger point thresholds.

11. Circuitry for receiving a data signal and a timing data signal, the circuitry operative to:
   determine noise periods from the timing data signal;
   determine noiseless periods from the timing data signal; and
   adjust a trigger point threshold of the data signal only during the noiseless periods, wherein the trigger point threshold determines where bits of the data being transferred from one circuitry to another switch value.

12. The circuitry of claim 11, wherein the circuitry is further operative to detect a plurality of trigger point thresholds.

13. The circuitry of claim 12, wherein the circuitry is further operative to adjust the trigger point threshold by periodically setting the trigger point threshold as an average of the detected trigger point thresholds.

14. The circuitry of claim 11, wherein the circuitry is further operative to set the trigger point threshold during a noise period.

15. The circuitry of claim 14, wherein the circuitry is further operative to detect a last trigger point threshold before the noise period.

16. The circuitry of claim 15, wherein the circuitry is further operative to set the trigger point threshold during the noise period as the last trigger point threshold.

17. The circuitry of claim 14, wherein the circuitry is further operative to detect a plurality of trigger point thresholds before the noise period.

18. The circuitry of claim 17, wherein the circuitry is further operative to set the trigger point threshold during the noise period as an average of the detected plurality of trigger point thresholds.

* * * * *

UNITED STATES PATENT AND TRADEMARK OFFICE
CERTIFICATE OF CORRECTION

PATENT NO. : 7,786,755 B2  
APPLICATION NO. : 12/240697  
DATED : August 31, 2010  
INVENTOR(S) : Wei Yao et al.

Page 1 of 1

It is certified that error appears in the above-identified patent and that said Letters Patent is hereby corrected as shown below:

In column 5, line 25-36, delete "Display circuitry 212 can also include display driver circuitry and/or circuitry for driving display driver(s). The display signals can be generated by processor 202 or display circuitry 212. The display signals can provide media information related to media data received from communications circuitry 214 and/or any other component of circuitry 200. In some embodiments, display circuitry 212, like any other component discussed herein, can be integrated into and/or electrically coupled to electrical device 100. For example, display circuitry 212 can be integrated into the display component of a multi-touch display component 102 and can communicate directly with processor 202 and/or input circuitry 208." and insert the same on Col. 5, Line 24 as a continuation of the paragraph.

Signed and Sealed this
Fifteenth Day of November, 2011

David J. Kappos
*Director of the United States Patent and Trademark Office*